United States Patent
Hiraishi

(10) Patent No.: US 6,314,741 B1
(45) Date of Patent: Nov. 13, 2001

(54) THERMOELECTRIC DEVICE

(75) Inventor: Hisato Hiraishi, Tokyo (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/284,831

(22) PCT Filed: Aug. 25, 1998

(86) PCT No.: PCT/JP98/03773

§ 371 Date: Apr. 21, 1999

§ 102(e) Date: Apr. 21, 1999

(87) PCT Pub. No.: WO99/10937

PCT Pub. Date: Apr. 3, 1999

(30) Foreign Application Priority Data

Aug. 25, 1997 (JP) .................................................. 9-228094

(51) Int. Cl.⁷ .................................................. F25B 21/02
(52) U.S. Cl. .................. 62/37; 136/203; 136/204
(58) Field of Search .................. 62/3.7, 3.1, 3.2; 136/203, 224

(56) References Cited

U.S. PATENT DOCUMENTS

| | | | |
|---|---|---|---|
| Re. 35,441 | * 2/1997 | Yokotani et al. | .................. 62/3.2 X |
| 3,097,027 | 7/1963 | Mims et al. | . |
| 5,705,434 | * 1/1998 | Imanishi et al. | .................. 136/201 X |
| 5,841,064 | * 11/1998 | Maekawa et al. | .................. 136/203 |
| 5,886,291 | * 3/1999 | Imanishi et al. | .................. 136/203 |
| 5,952,728 | * 9/1999 | Imanishi et al. | .................. 257/930 |
| 6,005,182 | * 12/1999 | Imanishi et al. | .................. 136/203 X |

FOREIGN PATENT DOCUMENTS

| | | |
|---|---|---|
| 2 119 170 A | 11/1983 | (GB) . |
| 58-64075 | 4/1983 | (JP) . |
| 360076179 | * 4/1985 | (JP) . |
| 362287678 | * 12/1987 | (JP) . |
| 63-70463 | 3/1988 | (JP) . |
| 3-196583 | 8/1991 | (JP) . |
| 5-335630 | 12/1993 | (JP) . |
| 407106642 | * 4/1995 | (JP) . |
| 8-153899 | 6/1996 | (JP) . |
| 8-228027 | 9/1996 | (JP) . |
| 8-316532 | 11/1996 | (JP) . |
| 411008417 | * 1/1999 | (JP) . |

* cited by examiner

Primary Examiner—Henry Bennett
Assistant Examiner—Chen-Wen Jiang
(74) Attorney, Agent, or Firm—Armstrong, Westerman, Hattori, McLeland & Naughton, LLP.

(57) ABSTRACT

Each of the n-type and p-type thermoelectric semiconductors (8, 9) are regularly arranged so that both end faces thereof form approximately flush interconnection end faces (3a, 3b) and are joined together through insulation, and interconnection electrodes (7) for alternately electrically connecting the n-type and p-type thermoelectric semiconductors (8, 9) are formed on both interconnection end faces (3a, 3b) to electrically connect the n-type and p-type thermoelectric semiconductors in series, thus obtaining a thermoelectric device block (3). A pair of connecting electrodes (6a, 6b) is formed to be electrically connected to the respective thermoelectric semiconductors corresponding to one end and the other end of a set of thermoelectric semiconductors connected in series in the thermoelectric device block (3). One of the interconnection end faces (3a) of the thermoelectric device block (3) is inserted into an opening (2a) of a flexible printed circuit (2) and then fixed onto an upper face of a thermal conduction plate (11) through an insulating layer so that a pair of the connecting electrodes (6a, 6b) is electrically connected to a pair of input/output electrodes (10a, 10b) formed on the flexible printed circuit (2), thus obtaining a thermoelectric device (20).

13 Claims, 5 Drawing Sheets

THERMOELECTRIC DEVICE

TECHNICAL FIELD

The present invention relates to a thermoelectric device for a power generator utilizing the Seebeck effect or a thermoelectric device for a cooler utilizing the Peltier effect and, more particularly, to a thermoelectric device which is small in size but high in performance.

BACKGROUND TECHNOLOGY

In a thermocouple, a voltage is generated by providing a difference in temperature between the opposite ends thereof. This is due to the Seebeck effect, and can be utilized for a device designed to extract the voltage as electric energy. The thermoelectric power generator wherein heat energy can be converted directly into electric energy has attracted much attention as effective means of utilizing heat energy, as represented by the case of waste heat utilization.

Meanwhile, the flow of a current caused to occur through a thermocouples results in generation of heat at one end thereof, and absorption of heat at the other end thereof. This is due to the Peltier effect, and a cooler can be manufactured by utilizing such phenomenon of heat absorption. This type of cooler which does not comprise mechanical components and can be reduced in size has an application as a portable refrigerator, or a localized cooler for lasers, integrated circuits, and the like.

Thus, a power generator or a cooler (thermoelectric device) made up of a thermoelectric element such as thermocouples is simple in its construction, and is in a more favorable condition for miniaturization as compared with other types of power generators or coolers, offering high usefulness. For example, with the thermoelectric device for use in the thermoelectric power generator, there will not arise a problem of leakage of electrolyte or depletion of power as with the case of a redox cell, and the thermoelectric device has therefore promising prospects for application to portable electronic apparatuses such as an electronic wrist watch.

The general construction of a conventional thermoelectric device has been disclosed in, for example, Japanese Patent Laid-open No. 58-64075, in which thermoelectric semiconductors of two dissimilar conductivity-type, p-type and n-type, are alternately and regularly arranged so that a multitude of thermocouples are formed in a two dimensional arrangement, and each thermocouple is electrically connected to the other in series through electrode plates.

In this construction, the thermoelectric device is formed in a board-like shape by the thermocouples in a two-dimensional arrangement. The upper surface and the under surface of the thermoelectric device becomes faces on which hot junctions and cold junctions of the thermocouples are located, respectively. In a case of a thermoelectric generation device, the thermoelectric generation is caused to occur by a difference in temperature between the upper surface and the under surface of the device.

Since portable electric apparatuses, having an expectation that such thermoelectric devices will be applied thereto, are usually used at around room temperature, it is not expected to obtain a sufficient degree of temperature difference inside of the portable electric apparatus. For example, in the case of a wrist watch, the temperature difference obtained in the watch through a body temperature and the ambient temperature will be 2° C.

However, an output voltage of a thermocouple, even using a BiTe-based material which is said to have the highest figure of merit at around room temperature, is about 400 $\mu V/°$ C. per couple, so that when the thermocouples using the BiTe-based material are incorporated into a wrist watch, an output voltage obtained is only 800 $\mu V$ per couple. Therefore, in order to obtain voltage over 1.5 V, which is necessary for driving the wrist watch, not less than about 2,000 couples of thermocouples are required to be incorporated.

Furthermore, in the case of an electronic wrist watch, wherein mechanical components and electric circuit components as well as the thermocouples need to be encased therein in spite of a small and limited internal volume thereof. Accordingly, an essential condition is that the design of a thermoelectric device itself be as small in size as possible.

Meanwhile, wiring is required for an electrical connection between the thermoelectric device and external circuits, and thus, as disclosed in aforementioned Japanese Patent Laid-open No. 58-64075, the connection is performed by respectively connecting lead wires to electrode plates located at both ends of a set of thermocouples connected in series.

As described hereinbefore, when a thermoelectric device is incorporated into a wrist watch, it is required that the thermoelectric device is designed to be as very small in size as possible, and additionally, a desired voltage can be obtained. However, as the thermoelectric device is decreased in size, the electrode plates for outputting voltage is reluctantly required to decrease in size.

In consequence, it would be extremely difficult to connect a lead wire onto the electrode plate so as to establish connection with the external circuit. In other words, it would be difficult to execute electrical connection between the thermoelectric device and the external circuits, which is necessary to practical use, resulting in difficulties of incorporation of the thermoelectric devices into portable electric apparatuses expecting of application.

DISCLOSURE OF THE INVENTION

It is an object of the present invention to resolve the aforementioned disadvantages and facilitate an electrical connection between an external circuit and a compact and high-performance thermoelectric device.

To achieve the above object, the thermoelectric device according to the present invention employs the following construction.

A thermoelectric device block is structured so that a first conductivity-type thermoelectric semiconductor and a second conductivity-type thermoelectric semiconductor, which have a column shape of equal length to each other, are regularly arranged to form approximately flush interconnection end faces at both end faces of the thermoelectric semiconductors, and connected together through insulation, and the first and second conductivity-type thermoelectric semiconductors are electrically connected in series on the interconnection end faces by interconnection electrodes.

A pair of connecting electrodes which are electrically connected to the respective thermoelectric semiconductors corresponding to one end and the other end of a set of the thermoelectric semiconductors connected in series, is formed on the above thermoelectric device block.

In addition, the thermoelectric device is composed of a thermal conduction plate having an upper face larger than an outer shape of the thermoelectric device block, and having an insulating layer, which is made of any one of metal and insulation member having high thermal conductivity, on at least the upper face; and a pair of input/output electrodes formed on the upper face side of the thermal conduction plate to be electrically insulated from the thermal conduction plate.

One of the interconnection end faces of the thermoelectric device block being fixed onto the upper face of the thermal conduction plate to establish an electrical connection of the each connecting electrode with the each input/output electrodes through a conductive member.

Note that a pair of the connecting electrodes is preferably formed on faces (side faces) other than the interconnection end faces of the thermoelectric device block.

In this case, preferably, the thermoelectric semiconductors, respectively corresponding to one end and the other end of a set of thermoelectric semiconductors connected in series in the aforementioned thermoelectric device block, are exposed on faces, excluding the interconnection end faces, on which a pair of the connecting electrodes is formed to be electrically connected to the respective exposed faces of the thermoelectric semiconductors.

The thermoelectric device can be structured so that an insulator substrate, such as a flexible printed circuit (FPC), which has a pair of the input/output electrodes and an opening corresponding to the outer shape of the thermoelectric device block, is provided on the upper face of the thermal conduction plate, so that one of the interconnection end faces of the thermoelectric device block is secured onto the thermal conduction plate through the opening of the insulator substrate to establish electrical connections of a pair of the connecting electrodes with a pair of the input/output electrodes on the insulator substrate.

Alternatively, the thermoelectric device of the present invention may be structured so that a pair of the connecting electrodes is formed on one of the interconnection end faces of the thermoelectric device block; the thermal conduction plate is shaped in a two-level form having a high-level portion and a low-level portion surrounding the high-level portion; an insulator substrate, such as FPC, which has an opening for inserting the high-level portion therein and a pair of the input/output electrodes on the upper face thereof, is formed on the upper face of the thermal conduction plate; and the above interconnection end face of the thermoelectric device block is fixed onto an upper face of the high-level portion of the thermal conduction plate to oppose a pair of the connecting electrodes to a pair of the input/output electrodes on said insulator substrate in close proximity, and the opposed electrodes are electrically connected by a conductive member.

In the aforementioned thermoelectric devices, it is advisably that a top thermal conduction plate is fixed onto the interconnection end face of the thermoelectric device block to be insulated from the interconnection end face. Preferably, the top thermal conduction plate has elasticity in a thickness direction thereof.

Alternatively, the thermoelectric device of the present invention can be structured so that the thermal conduction plate is formed to allow the provision of a plurality of the thermoelectric device blocks so that a plurality of the thermoelectric device blocks are placed on the thermal conduction plate to fix the respective interconnection end faces onto the upper face of the thermal conduction plate .

In this case, one electrode and the other electrode of the input/output electrodes, which are electrically connected to the opposite connecting electrodes of the adjacent thermoelectric device blocks respectively, can be mutually connected on the thermal conduction plate, to thereby connect a plurality of the thermoelectric device blocks in series. The thermal conduction plate may be formed in a ring shape.

BEST MODE FOR CARRYING OUT THE INVENTION

Preferred embodiments according to the present invention will be described below in detail with reference to the attached drawings.

Figure 1:
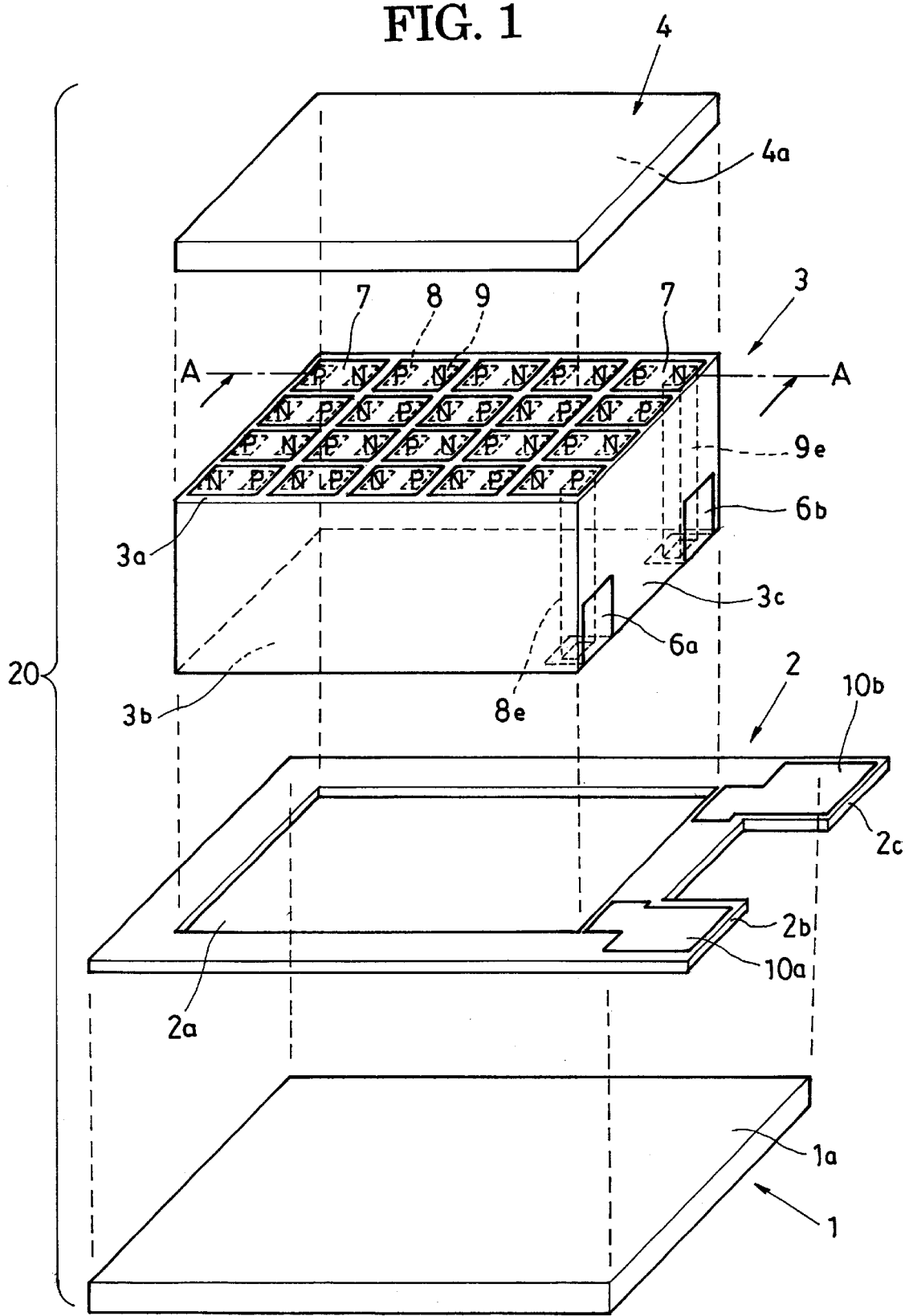
FIG. 1 is a perspective exploded view showing a first embodiment of a thermoelectric device according to the present invention.
Figure 2:
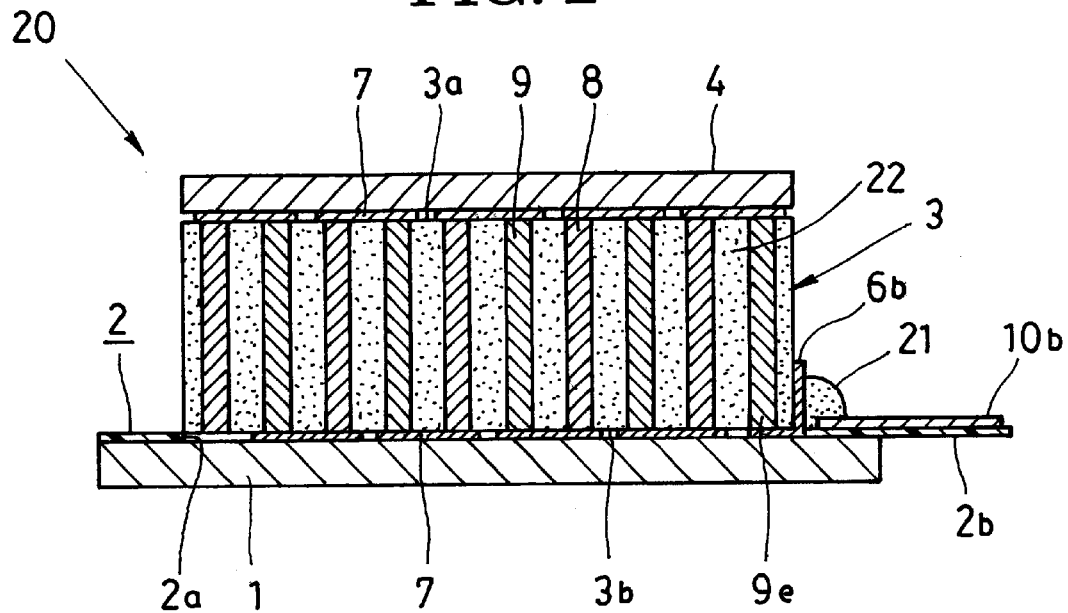
FIG. 2 is a sectional view of a vertical face taken along the A-A line of FIG. 1.

First Embodiment: FIGS. 1 and 2

A first embodiment of a thermoelectric device according to the present invention will be now explained with reference to FIG. 1 and FIG. 2.

A thermoelectric device 20 illustrated in FIG. 1 has basic components of a bottom thermal conduction plate 1, a flexible printed circuit 2, a thermoelectric device block 3 and a top thermal conduction plate 4, in which these components are assembled as one unit in the arrangement shown in FIG. 1.

The bottom thermal conduction plate 1 and the top thermal conduction plate 4 are each a rectangular plate having high thermal conductivity in a thickness direction. As material of both plates, use of metal such as copper or aluminum is preferable due to its high thermal conductivity. This is on the grounds that when the thermoelectric device 20 is installed in and applied for some apparatus, thermal gradient between a structure of the apparatus and the thermoelectric device block 3 is reduced as low as possible so as to improve performance of the thermoelectric device 20. An upper face 1a of the bottom thermal conduction plate 1 is larger in size than an outer shape of the thermoelectric device block 3.

Since the bottom thermal conduction plate 1 and the top thermal conduction plate 4 are respectively secured onto a lower interconnection end face and an upper interconnection end face of the thermoelectric device block 3, it is necessary to avoid causing short circuit between a number of interconnection electrodes 7 formed on the interconnection end faces, described hereinafter, of the thermoelectric device block 3 in the above securing process. Hence, insulating layers are respectively formed on the upper face 1a of the bottom thermal conduction plate 1 and a lower face 4a of the top thermal conduction plate 4 on which the thermoelectric device block 3 is secured. If the thermal conduction plates 1 and 4 are of aluminum plates, they perform the "Arumaito" (Alumilite) processing so as to form an insulator of aluminum oxide on each surface thereof as the insulating layer.

Alternatively, an insulating coating can be formed on the surface of a metallic plate or an insulating layer can be formed thereon by adhering an insulator sheet.

When the bottom thermal conduction plate 1 and the top thermal conduction plate 4 are secured to the thermoelectric device block 3 with an adhesive material as described hereinafter, an adhesive layer formed of the adhesive material can be used as an insulating layer.

However, a thickness of the adhesive layer is not easily adjusted, so that there is the risk of unpredictable short circuit. Hence, the insulating layer is preferably formed at least on the upper face 1a of the bottom thermal conduction plate 1 and at least on the lower face 4a of the top thermal conduction plate 4.

Yet another option is that, as each of the thermal conduction plates 1 and 4, insulator having high thermal conductivity (e.g. a ceramic plate made of alumina or the like) can be used. In this case, the whole plate is an insulating layer, thus short circuit does not occur.

The flexible printed circuit (hereinafter called FPC) 2 can be of a general-purpose sheet including a base film made of polyimide, polyethylene terephthalate or the like. This FPC 2 is formed by a die-cutting process to have an outer shape approximately corresponding to that of the bottom thermal conduction plate 1, and an opening 2a having a shape corresponding to the outer shape of the thermoelectric device block 3. In the drawing, a pair of protrusions 2b and 2c is formed on the right side of the FPC 2.

The provision of the opening 2a is a key role for the FPC 2. The opening 2a has an appropriate size to receive the outer periphery of the thermoelectric device block 3. As shown in FIG. 2, the opening 2a is provided in order not to locate the base film of the FPC 2 between the thermoelectric device block 3 and the bottom thermal conductive plate 1. On the upper faces of the protrusions 2b and 2c, a pair of input/output electrodes 10a and 10b is respectively formed by patterning copper foil, which is attached on the base film, through an etching.

Regarding the formation of the thermoelectric device block 3, a plurality of a first conductivity-type column-shaped p-type thermoelectric semiconductors 8 and a plurality of a second conductivity-type column-shaped n-type thermoelectric semiconductors 9 are alternately and regularly arranged to form interconnection end faces 3a and 3b, having approximately flush faces on both end faces of the semiconductors, and then, as shown in FIG. 2, they are joined together through insulation 22 (for example, epoxy resin).

This thermoelectric device block 3 is fabricated by, for example, the method disclosed in Japanese Patent Laid-open No. 63-70463 . Note that, in the embodiment, a sintered material of BiTeSb is used as the p-type thermoelectric semiconductor 8 and a sintered material of BiTeSe is used as the n-type thermoelectric semiconductor 9.

The upper face and the under face of the thermoelectric device block 3 respectively form the interconnection end faces 3a and 3b on which a plurality of the interconnection electrodes 7 are formed, to thereby make the alternate connections between the p-type thermoelectric semiconductors 8 and the n-type thermoelectric semiconductors 9 in series, as shown in FIG. 2.

As shown in FIG. 1, a pair of connecting electrodes 6a and 6b is formed on the lower portion of a side face 3c excluding the interconnection end faces 3a and 3b of the thermoelectric device block 3. These connecting electrodes 6a and 6b are electrically connected to respective thermoelectric semiconductors 8e and 9e corresponding to one end and the other end of a set of thermoelectric semiconductors 8 and 9 connected in series which makes up the thermoelectric device block 3.

The connecting electrodes 6a and 6b and a plurality of the interconnection electrodes 7 can be formed by a vacuum evaporation method using a metallic masking, alternatively, can be also formed as a laminated film of a total of approximately 1.5 $\mu$m thickness using nickel (Ni) and gold (Au) for their materials. It should be mentioned that the connecting electrodes 6a and 6b are each formed continuously extending between the side face 3c and the under interconnection end face 3b, and are respectively connected to the bottom ends of the thermoelectric semiconductors 8e and 9e positioned at both ends of the aforementioned connection in series.

The thermoelectric device block 3, for example, can include thermocouples composed of about 1,100 pairs consisting of the p-type thermoelectric semiconductors 8 and the n-type thermoelectric semiconductors 9 in dimensions of 8 mm wide, 5 mm deep and 2 mm high with the external shape illustrated in FIG. 1. Regarding the thermoelectric device block 3, when a temperature difference of 1.5° C. was directly given to the interconnection end faces 3a and 3b, using the thermal conduction plates 1, and 4, 0.65V of an open circuit voltage was obtained.

After the thermoelectric device block 3 is inserted into the opening 2a of the FPC 2, the lower interconnection end face 3b is adhered onto the upper face 1a of the bottom thermal conduction plate 1 with adhesives, while the upper interconnection end face 3a is adhered onto the lower face 4a of the top thermal conduction plate 4, which has the same size as that of the interconnection end face 3a, with similar adhesives.

In this point, since a thick layer of the adhesive causes decrease of thermal contact, the adhesive layer is required to be as thin as possible (about a few $\mu$m). For example, a thermosetting epoxy resin is used as the adhesives.

Regarding the FPC 2, the protrusions 2b and 2c provided with input/output electrodes 10a and 10b respectively are jutted out to have flexibility, while the FPC 2 is combinedly secured onto the upper face 1a of the bottom thermal conduction plate 1 with a tackiness agent or adhesives.

The FPC 2 is not sandwiched between the thermoelectric device block 3 and the bottom thermal conduction plate 1 due to the provision of the opening 2a. Hence, a thermal gradient does not occur under the influence of the base film of the FPC 2 which has a low thermal conductivity. This effects a tight thermal contact of the upper face 1a of the bottom thermal conduction plate 1 with the interconnection end face 3b so as to maintain a small temperature difference, resulting in retainment of effective performance of the thermoelectric device 20.

And then, as shown in FIG. 2, a pair of the input/output electrodes 10a and 10b on the FPC 2 is respectively electrically connected to a pair of the connecting electrodes 6a and 6b of the thermoelectric device block 3 by conductive members 21, such as silver paste, thereby completing the thermoelectric device 20.

As the conductive member 21 for electrical connection between the input/output electrodes 10a and 10b and the connecting electrodes 6a and 6b, solder instead of silver paste may be used or wire bonding can be applied in a special case.

When a temperature difference of 1.5° C. between the bottom thermal conduction plate 1 and the top thermal conduction plate 4 was given to the completed thermoelectric device 20, 0.61V of an open circuit voltage was obtained. Thus almost no decrease in output voltage is observed as compared with that of the aforementioned experiment for individual thermoelectric device block 3.

In the thermoelectric device 20 described thus far, a pair of the connecting electrodes 6a and 6b is respectively connected to the thermoelectric semiconductors 8e and 9e positioned at one end and other end of a set of the thermoelectric semiconductors connected in series which makes up the thermoelectric device block 3, while the connecting electrodes 6a and 6b are respectively connected to a pair of the input/output electrodes 10a and 10b. In consequence, the protrusions 2b and 2c, formed on the FPC 2 and having flexibility, are inserted into a socket having spring properties, whereby the connection to an external circuit is easily achieved so as to output the output voltage of the thermoelectric device block 3 to the external circuit.

Note that the correlative configurations of the bottom thermal conduction plate 1, the top thermal conduction plate 4 and the thermoelectric device block 3, which are described hereinbefore, are in a design matter depending upon apparatus providing the thermoelectric device therein, thus the embodiment is merely an example. In the embodiment, the board for forming the input/output electrodes 10a, 10b is a flexible sheet, but a printed board having no flexibility or a simple insulator substrate can be also used.

Figure 3:
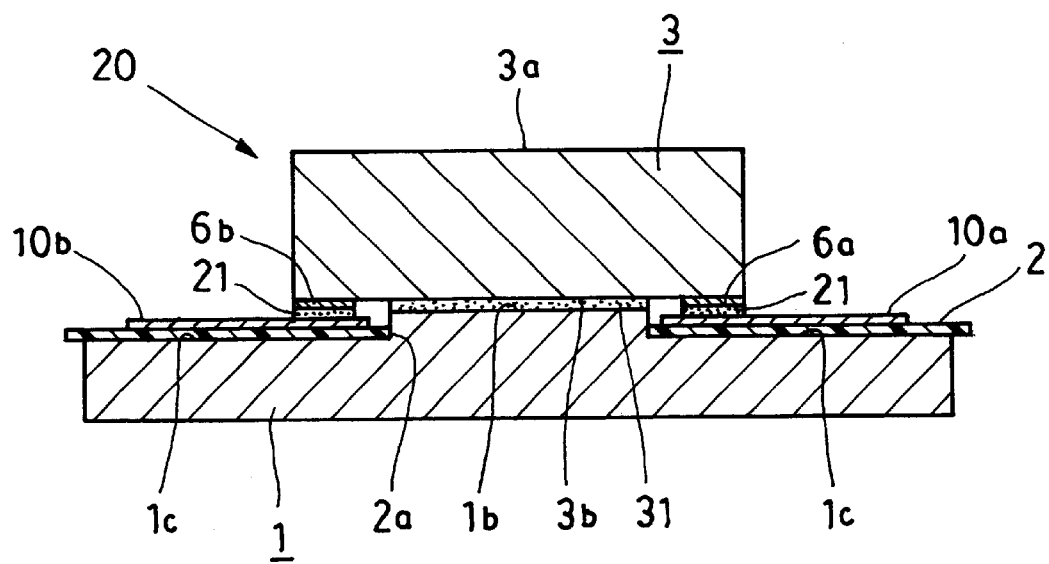
FIG. 3 is a sectional view, similar to FIG. 2, showing a second embodiment of a thermoelectric device according to the present invention.

Second Embodiment: FIG. 3

The second embodiment of a thermoelectric device according to the present invention will be now described with reference to FIG. 3. Incidentally, FIG. 3 is a sectional view of the thermoelectric device, similar to that in FIG. 2, of this embodiment, in which the same reference numerals are used to designate components corresponding to those of FIGS. 1 and 2.

In the thermoelectric device 20 of the embodiment, the shape of a bottom thermal conduction plate 1, the position of forming the connecting electrode 6 in the thermoelectric device block 3 and the shape of the opening 2a of the FPC 2 are different from those in the first embodiment, so that the description will be provided hereinafter with emphasis on the above these different points, and the detailed description of common points with the first embodiment is omitted.

The bottom thermal conduction plate 1 illustrated in FIG. 3 does not have a plate-shape with a flat upper surface, and has a two level form which is composed of a high-level portion 1b, having a width shorter than that (a length in the horizontal direction in FIG. 3) of the thermoelectric device block 3, and a low-level portion 1a surrounding the high-level portion 1c.

The FPC 2 has the opening 2a which has a shape conforming to the shape of high-level portion 1b of the bottom thermal conduction plate 1. On the upper face of the FPC 2, a pair of the input/output electrodes 10a and 10b is respectively formed to extend outward from the vicinities of right and left sides of the opening 2a in FIG. 3.

In the thermoelectric device block 3, a pair of the connecting electrodes 6a and 6b is respectively formed on the vicinities of the right and left edges (in FIG. 3) of an interconnection end face 3b on the under side face of the block 3.

The thermoelectric device 20 in the embodiment is fabricated and completed by the following steps.

First, the high-level portion 1b of the bottom thermal conduction plate 1 is inserted into the opening 2a, thereafter the FPC 2 is secured onto the low-level portion 1c with a tackiness agent or the like.

Secondly, the interconnection end face 3b of the thermoelectric device block 3 is adhered on the top surface of the high-level portion 1b of the bottom thermal conduction plate 1 by means of the provision of an adhesive layer 31, made of an insulating adhesive, thus fixing the thermoelectric device block 3. In this state, a pair of the connecting electrodes 6a and 6b, which are provided on the interconnection end face 3b of the thermoelectric device block 3, and a pair of the input/output electrodes 10a and 10b provided on the FPC 2 are proximately faced in parallel to each other. And then the conductive member 21, such as a conductive paste or solder, is filled to electrically connect the opposite electrodes 6a and 10a and also to electrically connect the opposite electrodes 6b and 10b. Thus completing the thermoelectric device 20.

In this thermoelectric device 20, since the connecting electrodes 6a and 6b and the input/output electrodes 10a and 10b are oppositely arranged with slight voids between them, the stability of connection by means of the conductive member 21 is improved.

Moreover, the connecting electrodes 6a and 6b can be formed concurrently with interconnection electrodes 7 on the interconnection end face 3b of the thermoelectric device block 3, thus the connecting electrodes 6 and the interconnection electrodes 7 may be fabricated easily.

Note that the top thermal conduction plate is omitted in the embodiment, but it may be provided if necessary. Provided that the adhesion layer 31 having a stable thickness formed on the top surface of the high-level portion 1b of the bottom thermal conduction plate 1, the insulation properties of the interconnection electrodes 7 formed on the interconnection end face 3b can be ensured due to function of the adhesion layer 31 as an insulating layer, resulting in the possibility of using a metal plate having no insulating coating as the bottom thermal conduction plate 1.

Figure 4:
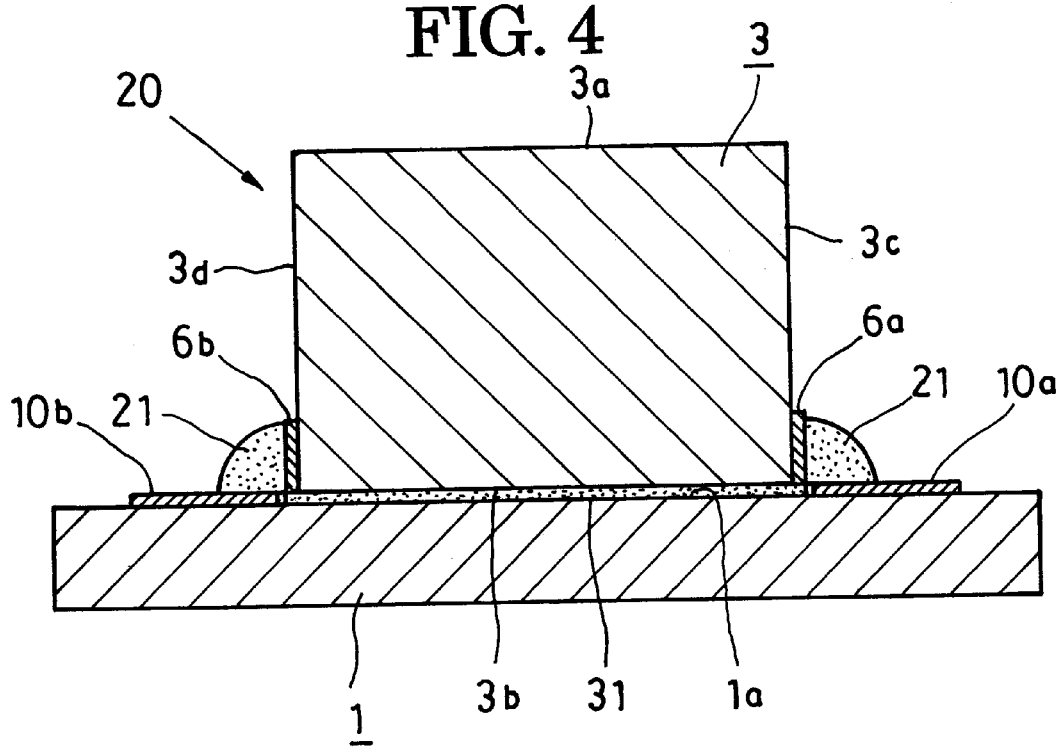
FIG. 4 is a sectional view, similar to FIG. 2, showing a third embodiment of a thermoelectric device according to the present invention.
Figure 5:
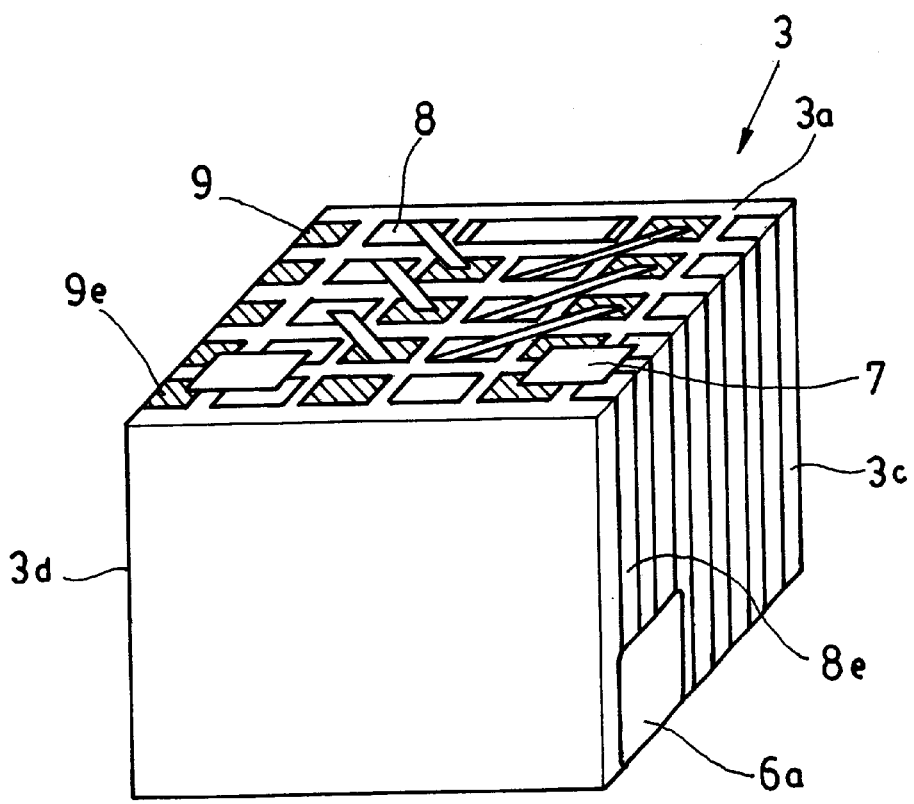
FIG. 5 is a perspective view of a thermoelectric device block thereof.

Third Embodiment: FIGS. 4 and 5

The third embodiment of a thermoelectric device according to the present invention will be now described with reference to FIG. 4 and FIG. 5.

FIG. 4 is a sectional view, similar to FIG. 2, of the thermoelectric device, and FIG. 5 is a view showing only the thermoelectric device block 3 thereof, in which the same reference numerals are used to designate components corresponding to those of FIGS. 1 to 3.

The thermoelectric device 20 of this embodiment has the following different points from that of the first embodiment: the input/output electrodes 10a and 10b are directly formed on the top face of the bottom thermal conduction plate 1 without using of the FPC 2; the connecting electrodes 6a and 6b form in different positions in the thermoelectric device block 3; and the top thermal conduction plate 4 is omitted. Therefore, the description will be provided hereinafter with emphasis on the above different points, and the detailed description of common points with the first embodiment is omitted.

As shown in FIG. 5, the thermoelectric device block 3 in this embodiment is processed to expose the p-type thermoelectric semiconductor 8e and the n-type thermoelectric semiconductor 9e, respectively corresponding to at least both ends of a set of the p-type and n-type thermoelectric semiconductors 8 and 9 connected in series, on both of the opposite side faces 3c and 3d. In the lower portions of the side faces 3c and 3d, a pair of the connecting electrodes 6a and 6b is formed to be electrically connected onto the exposed faces of the thermoelectric semiconductors 8e and 9e, respectively.

The interconnection end face 3b of the above thermoelectric device block 3 is adhered on the upper face 1a of the bottom thermal conduction plate 1 through the adhesion layer 31 made of a conductive adhesive. In addition, the connecting electrodes 6a and 6b are electrically connected to respective input/output electrodes 10a and 10b by means of the conductive member 21 such as a conductive paste or solder.

According to the above structure, the number of used components are conveniently reduced due to the absence of the FPC 2, thereby simplifying assemble processes. It should be mentioned that, in the embodiment, a ceramic plate as insulation, made of pure alumina, is used as the bottom thermal conduction plate 1, and a stacked thin film made of Cr and Cu is formed on the upper face thereof by a sputtering, and then the input/output electrodes 10a and 10b are formed through patterning by etching.

In the thermoelectric device block 3, the thermoelectric semiconductors 8 and 9, which are positioned in rows along the side faces 3c and 3d including the thermoelectric semiconductors 8e and 9e at both ends of the connection in series, are exposed, and merely function for interconnection.

Figure 6:
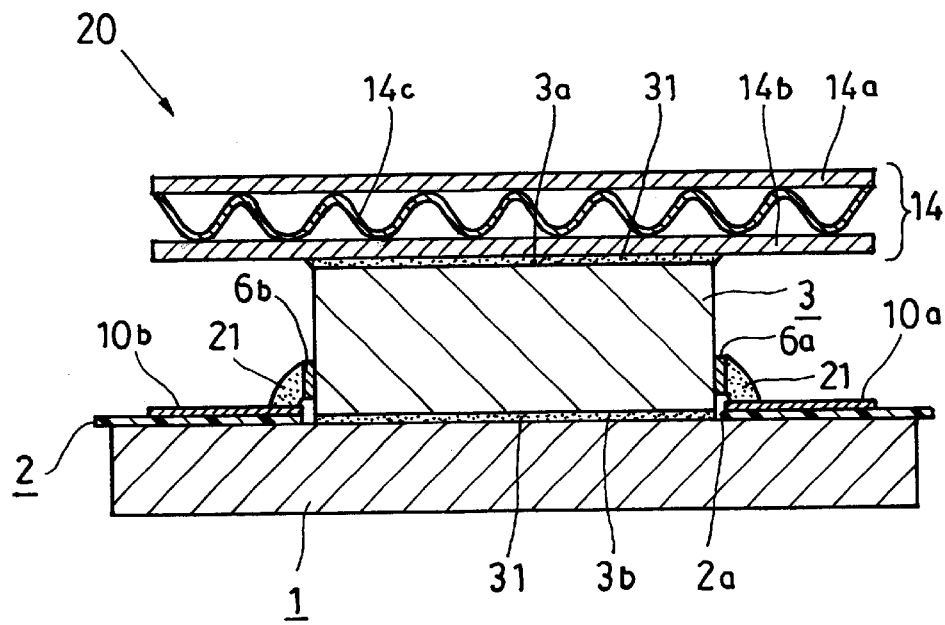
FIG. 6 is a sectional view, similar to FIG. 2, showing a fourth embodiment of a thermoelectric device according to the present invention.

Fourth Embodiment: FIG. 6

The fourth embodiment of a thermoelectric device according to the present invention will be now described with reference to FIG. 6.

FIG. 6 is a sectional view, similar to FIG. 2, of the thermoelectric device, in which the same reference numerals are used to designate components corresponding to those of FIGS. 1 to 5.

The thermoelectric device 20 of the embodiment has the following different points from the thermoelectric device 20 of the first embodiment: an elastic thermal conduction plate 14 is used as a top thermal conduction plate; and the thermoelectric device block 3 designed as a side-face exposed type similar to that in the third embodiment; and thermoelectric device block 3 has a pair of the connecting electrodes 6a and 6b on the right and left side faces and a pair of the input/output electrodes 10a and 10b of the FPC 2, which are electrically connected to respective electrodes 6a and 6b, are formed separately on the right and left sides of the opening 2a. Other points are in common with the first embodiment, so that the detail description is omitted.

The elastic thermal conduction plate 14 has two copper sheets 14a and 14b, each having a thickness of approximate 0.15 mm, with a copper made thin corrugated sheet 14c in between, all of which are unitedly combined by welding, thus the plate 14 has elasticity in a thickness direction thereof.

Since this elastic thermal conduction plate 14 is secured onto the thermoelectric device block 3 with adhesives having insulation properties, the insulation properties of the interconnection electrodes on the interconnection end face 3a is ensured by the adhesive layer 31. However, the plate preferably has an electrical insulating layer at least on the side surface which is directly adjoined to the thermoelectric device block 3, while it is required not to loss thermal conductivity in the direction of plate thickness. Hence, on the lower face of the bottom copper sheet 14b, an insulating layer is desirably provided by forming an alumina film through a spray coating.

When the thermoelectric device 20 is incorporated into a portable electronic apparatuses or the like, it is important to establish a tight thermal-contact of the thermoelectric device with the portable electronic apparatus or the like. Hence, in the embodiment, the elastic thermal conduction plate 14 is used to obtain elasticity in the thickness direction of the thermoelectric device 20, thus the elastic thermal conduction plate 14 absorbs processing dimensional errors or the like from the design condition of the portable electronic apparatus with the elasticity, and additionally, the tight thermal-contact may be achieved by the elastic thermal conduction plate 14.

Figure 7:
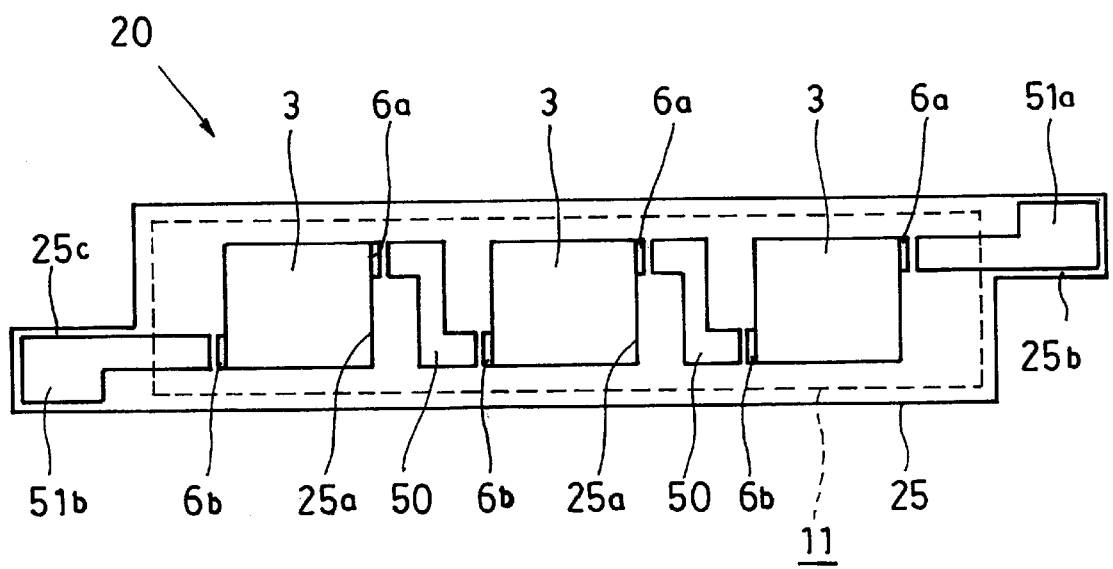
FIG. 7 is a plane view showing a fifth embodiment of a thermoelectric device according to the present invention.

Fifth Embodiment: FIG. 7

The fifth embodiment of a thermoelectric device according to the present invention will be described hereinafter with reference to the plane view of FIG. 7.

Each thermoelectric device 20 of the aforementioned embodiments is structured to secure the single thermoelectric device block 3 onto the bottom thermal conduction plate 1. However, the thermoelectric device of the present invention includes a thermoelectric device having the structure in which a plurality of thermoelectric device blocks 3 are provided on the same bottom thermal conduction plate.

FIG. 7 illustrates an example of a case in which a plurality of the thermoelectric device blocks 3 are separately arranged, in which the same reference numerals are used to designate components corresponding to those in the drawings referred in the aforementioned embodiments.

A thermal conduction plate 11 in the embodiment is formed in an elongated shape as represented by a dashed line in FIG. 7 so that a plurality of (three in the drawing) the thermoelectric device blocks 3 are aligned at spaced intervals.

A flexible printed circuit (FPC) 25 having a plurality of openings 25a is secured on the thermal conduction plate 11. On the top surface of the FPC 25 and between the adjacent openings 25a, interconnection patterns 50, 50 are formed, each of which also serves as an input/output electrode electrically connected to different electrodes of each pair of the connecting electrodes 6a and 6b of the adjacent thermoelectric device blocks 3. At both ends of the FPC 25 in the longitudinal direction, protrusions 25b and 25c are provided. Additionally, on the top faces of the protrusions 25b and 25c, terminal electrodes 51a and 51b are respectively formed to be electrically connected to the one of connecting electrodes 6a and 6b of the thermoelectric device blocks 3 which are respectively positioned at ends of the aligned blocks 3.

In each thermoelectric device block 3 of the embodiment, a pair of connecting electrodes 6a and 6b is separately provided on both sides in the aligning direction of blocks, respectively.

Meanwhile, a plurality of thermoelectric device blocks 3 are secured through an insulating layer onto the upper face of the thermal conduction plate 11 after the interconnection end faces formed on the bottom face of the blocks 3 are respectively passed through the openings 25a of the FPC 25.

Thereafter, a connecting electrode 6a of one thermoelectric device block 3 and a connecting electrode 6b of the adjacent thermoelectric device block 3 are connected to the same interconnection pattern 50 by a conductive member (not shown) such as a conductive paste, solder or the like. A connecting electrode 6a of the thermoelectric device block 3 which is positioned at one end of the aligned blocks is connected to the terminal electrode 51a by the conductive member, while another connecting electrode 6b of the thermoelectric device block 3 which is positioned at the other end of the aligned blocks is connected to the terminal electrode 51b by the conductive member.

As described thus far, a plurality of the thermoelectric device blocks 3, 3, ..., are connected in series, so that a high output voltage can be obtained. Additionally, a plurality of the thermoelectric device blocks 3 are separately aligned on the thermal conduction plate 11, thus enhancing the design flexibility for the thermoelectric device 20, and moreover, effecting advantage in the manufacturing yield of each thermoelectric device block 3.

Note that the thermoelectric device block 3 in the embodiment is described as similar to the fourth embodiment, but it can be structured similarly to those of other embodiments described hereinbefore.

Furthermore, with the absence of FPC, the interconnection pattern 50 and the terminal electrodes 51a and 51b can be directly formed on the thermal conduction plate 11 having the insulating layer on at least the top face thereof. In this case, it is possible to form the interconnection pattern 50 and the terminal electrodes 51a and 51b simultaneously by means of vapor deposition or the like.

Figure 8:
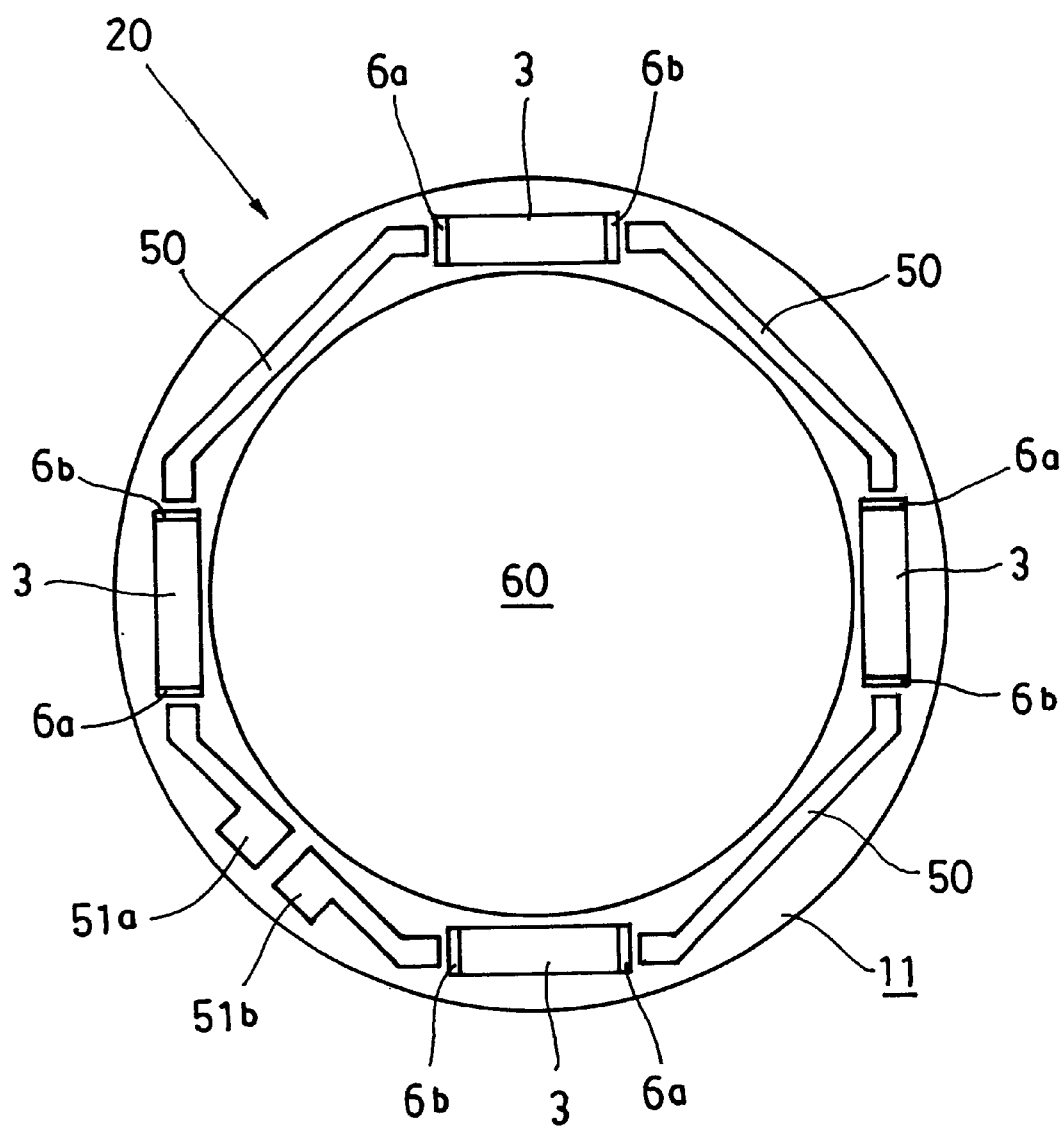
FIG. 8 is a plane view showing a sixth embodiment of a thermoelectric device according to the present invention.

Sixth Embodiment: FIG. 8

Finally, the sixth embodiment of a thermoelectric device according to the present invention will be described hereinafter with reference to a plane view in FIG. 8. In FIG. 8, the same reference numerals are used to designate components corresponding to those in FIG. 7.

The embodiment illustrates a thermoelectric device 20 having the separate arrangement of a plurality of thermoelectric device blocks 3, similar to that of the aforementioned fifth embodiment. The different points of the embodiment from the fifth embodiment are that the thermal conduction plate 11 is formed in a ring-shape; and that, not using FPC, the interconnection pattern 50 and the terminal electrodes 51a and 51b are directly formed on the top face of the ring-shaped thermal conduction plate 11 which has the insulating layer on at least the top face thereof.

Hence, the thermoelectric device blocks 3 are generally arranged on a circle along the bottom thermal conduction plate 11. Other points are common with those in the fifth embodiment, so that the detail description is omitted.

Regarding the above ring-shaped structure of the thermoelectric device 20, for example, when a thermoelectric device is used as a generator in a wrist watch, it can be easily placed in a space between a drive mechanism of timepiece and a case of the timepiece covering the drive mechanism, in which a movement (drive mechanism) and/or electric circuits of the wrist watch can be housed in the circular space 60 inside the thermoelectric device 20. Therefore, the thermoelectric device 20 may be a highly effective thermoelectric device as a generator in a wrist watch.

Note that an example that all the thermoelectric blocks 3 are connected in series is described in both this embodiment and the fifth embodiment, but depending on use, part of or all of the thermoelectric blocks 3 can be connected in parallel. In this case, the position of the connecting electrodes 6a and 6b and/or the layout of the interconnection patterns 50 may be varied with reference to the form of connection.

In the sixth embodiment, the configuration can be simplified due to the absence of FPC. However, as in the case of the fifth embodiment, the FPC 2 may be used. In this case, the FPC is shaped as a ring similar to the shape of the thermal conduction plate 11.

Industrial Applicability

A thermoelectric device according to the present invention allows easily and reliably achieving the electrical connection between an external circuit and a high-performance thermoelectric device block including numerous thermocouples notwithstanding a compact size.

In consequence, the compact and high-performance thermoelectric device blocks can be extremely easily incorporated into portable electronic apparatuses or the like.

For example, in using the thermoelectric device according to the present invention as a thermoelectric device for power generating, since it is small in size but a high output voltage is obtained, the thermoelectric device can be used as a temperature differential generator which is a power source in a portable electronic apparatus such as a wrist watch.

What is claimed is:

1. A thermoelectric device, comprising:

a thermoelectric device block in which thermoelectric semiconductors of a first conductivity-type and thermoelectric semiconductors of a second conductivity-type, which have a column-shape of equal length to each other, are regularly arranged to form approximately flush interconnection end faces at both end faces of the thermoelectric semiconductors, and jointed together through an insulating adhesive, and the thermoelectric semiconductors of the first and second conductivity-types are electrically connected in series on said interconnection end faces by interconnection electrodes;

a pair of connecting electrodes which are electrically connected to the respective thermoelectric semiconductors which correspond to one end and the other end of a set of said thermoelectric semiconductors connected in series in the thermoelectric device block;

a thermal conduction plate having an upper face larger than an outer shape of said thermoelectric device block, and having an insulating layer, which is made of any one of metal and insulation having high thermal conductivity, on at lest one said upper face thereof; and a pair of input/output electrodes formed on the upper face of the thermal conduction plate to be electrically insulated from the thermal conduction plate, wherein one of the interconnection end faces of said thermoelectric device block being fixed onto the upper face of said thermal conduction plate to establish an electrical connection of said each connecting electrode with said each input/output electrode through a conductive member.

2. The thermoelectric device according to claim 1, wherein a pair of said connecting electrodes is formed on faces other than the interconnection end faces of said thermoelectric device block.

3. The thermoelectric device according to claim 2, wherein the thermoelectric semiconductors, at least, corresponding to one end and the other end of a set of said thermoelectric semiconductors connected in series in said thermoelectric device block are exposed on faces excluding said interconnection end faces, and a pair of the connecting electrodes which are electrically connected to the exposed faces of said thermoelectric semiconductors respectively are formed thereon.

4. A thermoelectric device comprising:

a thermoelectric device block in which thermoelectric semiconductors of a first conductivity-type and thermoelectric semiconductors of a second conductivity-type, which have a column-shape of equal length to each other, are regularly arranged to form approximately flush interconnection end faces at both end faces of the thermoelectric semiconductors, and jointed together through insulation, and the thermoelectric semiconductors of the first and second conductivity-types are electrically connected in series on said interconnection end faces by interconnection electrodes;

a pair of connecting electrodes which are electronically connected to the respective thermoelectric semiconductors which correspond to one end and the other end of a set of said thermoelectric semiconductors connected in a series in the thermoelectric device block;

a thermal conduction plate having an upper face larger than an outer shape of said thermoelectric device block, and having an insulating layer, which is made of any one metal and insulation having high thermal conductivity, on at least said upper face thereof; and a pair of input/output electrode formed on the upper face of the thermal conduction plate to be electrically insulated from the thermal conduction plate, wherein an insulator substrate which has an opening corresponding to the outer shape of said thermoelectric device block and has a pair of said input/output electrodes, is provided on the upper face of said thermal conduction plate; and wherein one of the interconnection end faces of said thermoelectric device block is fixed onto the upper face of said thermal conduction plate through the opening of said insulator substrate to establish the electrical connection of a pair of said connecting electrodes with a pair of said out/output electrodes formed on said insulator substrate through a conductive member.

5. The thermoelectric device according to claim 4, wherein said insulator substrate is a flexible printed circuit.

6. The thermoelectric device according to claim 4, wherein a pair of said connecting electrodes is formed on a face other than the interconnection end faces of said thermoelectric device block.

7. The thermoelectric device according to claim 6, wherein said insulator substrate is a flexible printed circuit.

8. The thermoelectric device according to claim 1, wherein a pair of said connecting electrodes is formed on one of the interconnection end face of said thermoelectric device block;

wherein said thermal conduction plate has a two level form having a high-level portion and a low-level portion surrounding the high-level portion;

wherein an insulator substrate which has an opening for inserting said high-level portion and is provided with a pair of said input/output electrodes on an upper face thereof is provided on an upper face of the thermal conduction plate; and wherein said one of the interconnection end face of said thermoelectric device block is fixed onto an upper face of the high-level portion of said thermal conduction plate to oppose the pair of said connecting electrodes to the pair of said input/output electrodes on said insulator substrate in close proximity, and the opposed electrodes are electrically connected by a conducive member.

9. The thermoelectric device according to claim 1, wherein a top thermal conduction plate is fixed onto the other of said interconnection end face of said thermoelectric device block to be insulated from said interconnection electrodes.

10. The thermoelectric device according to claim 9, wherein said top thermal conduction plate has elasticity in the thickness direction thereof.

11. The thermoelectric device according to claim 1, wherein said thermal conduction plate is formed to allow the provision of a plurality of the thermoelectric device blocks so that a plurality of the thermoelectric device blocks are placed on the thermal conduction plate to fix one of the said respective interconnection end faces onto the upper face of the thermal conduction plate.

12. The thermoelectric device according to claim 11, wherein one electrode and the other electrode of said input/output electrodes, which are electrically connected to the opposite connecting electrodes of said adjacent thermoelectric device blocks respectively, are mutually connected on said thermal conduction plate to connect a plurality of said thermoelectric device blocks in series.

13. The thermoelectric device according to claim 12, wherein said thermal conduction plate has a ring-shape.

* * * * *